(12) United States Patent
Nishihara et al.

(10) Patent No.: US 8,749,320 B2
(45) Date of Patent: Jun. 10, 2014

(54) ACOUSTIC WAVE DEVICE AND METHOD FOR MANUFACTURING THE SAME

(75) Inventors: Tokihiro Nishihara, Tokyo (JP); Shinji Taniguchi, Tokyo (JP); Tsuyoshi Yokoyama, Tokyo (JP); Masanori Ueda, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 7 days.

(21) Appl. No.: 13/398,104

(22) Filed: Feb. 16, 2012

(65) Prior Publication Data

US 2012/0146744 A1 Jun. 14, 2012

Related U.S. Application Data

(63) Continuation of application No. PCT/JP2010/062147, filed on Jul. 20, 2010.

(30) Foreign Application Priority Data

Aug. 17, 2009 (JP) .................................. 2009-188531

(51) Int. Cl.

| H03H 9/54 | (2006.01) |
|---|---|
| H03H 9/15 | (2006.01) |
| H03H 9/17 | (2006.01) |
| H03H 9/13 | (2006.01) |
| H03H 9/60 | (2006.01) |
| H03H 9/58 | (2006.01) |
| H03H 3/04 | (2006.01) |

(52) U.S. Cl.
CPC ............... *H03H 9/173* (2013.01); *H03H 9/131* (2013.01); *H03H 9/132* (2013.01); *H03H 9/605* (2013.01); *H03H 9/587* (2013.01); *H03H 3/04* (2013.01)

USPC ............................ 333/189; 333/187; 310/312

(58) Field of Classification Search
USPC .......... 333/187–192; 310/312, 322, 324, 334, 310/335, 363–366
See application file for complete search history.

(56) References Cited

U.S. PATENT DOCUMENTS 6,114,795 A * 9/2000 Tajima et al. ................. 310/312
6,657,363 B1 12/2003 Aigner (Continued)

FOREIGN PATENT DOCUMENTS

| JP | 2001-326553 A | 11/2001 |
| JP | 2002-515667 A | 5/2002 |

(Continued)

OTHER PUBLICATIONS

Written Opinion (PCT/ISA/237) issued in PCT/JP2010/062147 mailed in Oct. 2010.

(Continued)

*Primary Examiner* — Barbara Summons
(74) *Attorney, Agent, or Firm* — Chen Yoshimura LLP (57) ABSTRACT

An acoustic wave device includes piezoelectric thin-film resonators, each of which includes: a substrate; a piezoelectric thin-film on the substrate; an lower electrode provided on a first surface of the piezoelectric film; an upper electrode provided on a second surface of the piezoelectric film opposite to the first surface; and a first addition film that is provided in a resonance portion in which the lower electrode and the upper electrode face each other through the piezoelectric film and is located between the piezoelectric thin-film and the upper electrode, the first addition film having a shape different from that of the resonance portion.

18 Claims, 11 Drawing Sheets

(56) References Cited

U.S. PATENT DOCUMENTS

| | | | |
|---|---|---|---|
| 6,788,170 B1 | 9/2004 | Kaitila et al. | |
| 6,812,619 B1 | 11/2004 | Kaitila et al. | |
| 7,236,066 B2* | 6/2007 | Ebuchi | 333/187 |
| 7,489,063 B2* | 2/2009 | Isobe et al. | 310/312 |
| 8,063,717 B2* | 11/2011 | Bradley et al. | 333/133 |
| 2002/0089393 A1* | 7/2002 | Tikka et al. | 333/133 |
| 2002/0121944 A1 | 9/2002 | Larson, III et al. | |
| 2002/0123177 A1 | 9/2002 | Ruby et al. | |
| 2004/0017130 A1* | 1/2004 | Wang et al. | 310/311 |
| 2004/0017269 A1* | 1/2004 | Gotoh et al. | 333/133 |
| 2005/0052261 A1 | 3/2005 | Yoon et al. | |
| 2005/0057117 A1* | 3/2005 | Nakatsuka et al. | 310/311 |
| 2005/0200433 A1* | 9/2005 | Aigner et al. | 333/191 |
| 2006/0131990 A1* | 6/2006 | Milsom et al. | 310/311 |
| 2006/0255883 A1 | 11/2006 | Ebuchi | |
| 2007/0069606 A1* | 3/2007 | Matsumoto et al. | 310/312 |
| 2007/0139140 A1* | 6/2007 | Rao et al. | 333/188 |
| 2007/0252662 A1 | 11/2007 | Nishihara et al. | |
| 2008/0169885 A1 | 7/2008 | Ueda et al. | |
| 2008/0290969 A1* | 11/2008 | Yamakawa et al. | 333/197 |
| 2010/0277034 A1* | 11/2010 | Sinha et al. | 310/312 |

FOREIGN PATENT DOCUMENTS

| | | |
|---|---|---|
| JP | 2002-335141 A | 11/2002 |
| JP | 2002-359539 A | 12/2002 |
| JP | 2003-505906 A | 2/2003 |
| JP | 2005-86835 A | 3/2005 |
| JP | 2006-319796 A | 11/2006 |
| JP | 2007-300216 A | 11/2007 |
| JP | 2008-172494 A | 7/2008 |
| JP | 2008-244653 A | 10/2008 |
| WO | 2007/000929 A1 | 1/2007 |

OTHER PUBLICATIONS

International Search Report (ISR) for PCT/JP2010/062147 mailed in Oct. 2010.

Japanese Office Action dated Nov. 12, 2013, in a counterpart Japanese patent application No. 2009-188531.

* cited by examiner

ACOUSTIC WAVE DEVICE AND METHOD FOR MANUFACTURING THE SAME

CROSS-REFERENCE TO RELATED APPLICATIONS

This application is a continuation application of PCT/JP2010/062147 filed on Jul. 20, 2010 claiming the benefit of priority of the prior Japanese Patent Application No. 2009-188531 filed Aug. 17, 2009, the entire contents of which are incorporated herein by reference.

FIELD

A certain aspect of the present invention relates to an acoustic wave device and a method for manufacturing the same. Another aspect of the present invention relates to an acoustic wave device including a piezoelectric thin-film resonator and a method for manufacturing such an acoustic wave device.

BACKGROUND

An acoustic wave device using a piezoelectric thin-film resonator is used as a filter provided in wireless communication equipment, for example. The piezoelectric thin-film resonator includes a film bulk acoustic resonator (FBAR) and is configured to have a piezoelectric thin-film having opposite surfaces on which upper and lower electrodes are respectively provided. The resonance frequency of the piezoelectric thin-film resonator depends on the thickness of a portion in which the upper and lower electrodes face each other through the piezoelectric thin-film. Such a portion is referred to as a resonance portion. In a case where the upper and lower electrodes are respectively made of different materials, the resonance frequency of the resonance portion depends on the materials as well as the film thickness.

Japanese Patent Application Publication No. 2002-335141 (Document 1) discloses an art in which an addition film is formed on the upper electrode in the resonance portion in order to change the resonance frequency of the piezoelectric thin-film resonator. U.S. Pat. No. 6,657,363 (Document 2) discloses an art of forming an opening in the addition film on the upper electrode in the resonance portion.

According to the art disclosed in Document 1, resonators having different resonance frequencies are realized by forming addition films having different thicknesses. Such addition films are formed by repeatedly performing the process of forming one addition film a number of times corresponding to the number of different resonance frequencies. This increases the production cost.

The art disclosed in Document 2 needs etching for forming an opening in the addition film on the upper electrode. Therefore, it is required that the addition film has etching selectivity to the upper electrode. This requirement limits the range of selection of materials for the addition film. Further, the use of a single-layer addition film leads to a limited range of the film thickness in which the resonance performance is kept and the resonance frequency is adjustable.

SUMMARY OF THE INVENTION

According to an aspect of the present invention, there is provided an acoustic wave device comprising piezoelectric thin-film resonators, each of which includes: a substrate; a piezoelectric thin-film on the substrate; an lower electrode provided on a first surface of the piezoelectric film; an upper electrode provided on a second surface of the piezoelectric film opposite to the first surface; and a first addition film that is provided in a resonance portion in which the lower electrode and the upper electrode face each other through the piezoelectric film and is located between the piezoelectric thin-film and the upper electrode, the first addition film having a shape different from that of the resonance portion.

DETAILED DESCRIPTION

Embodiments of the invention are now described with reference to the accompanying drawings.

First Embodiment

Figure 1:
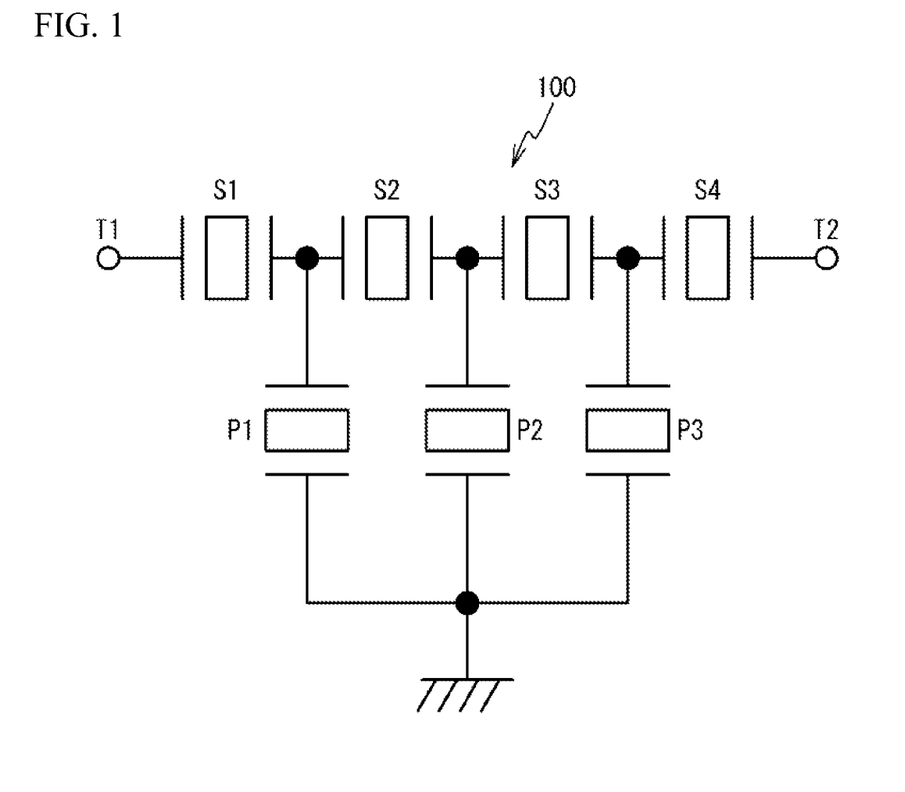
FIG. 1 is a circuit diagram of a ladder type filter.
Figure 2A:
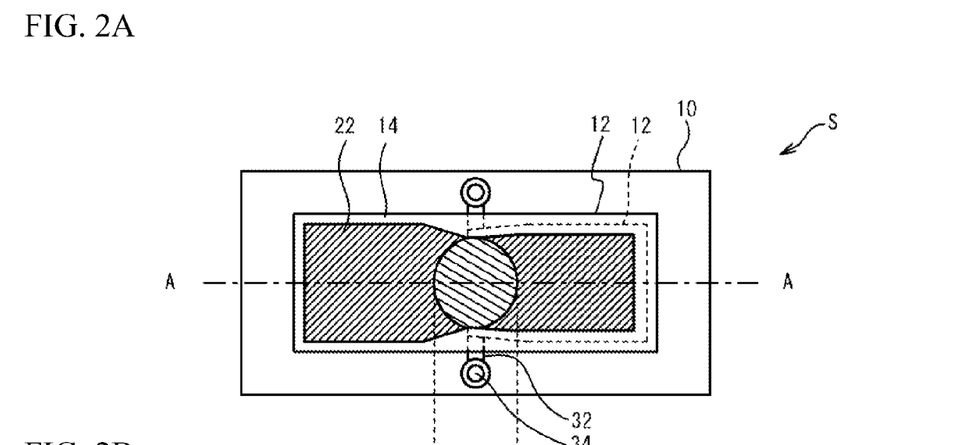
FIG. 2A is a plan view of a piezoelectric thin-film resonator used in a first embodiment.
Figure 2B:
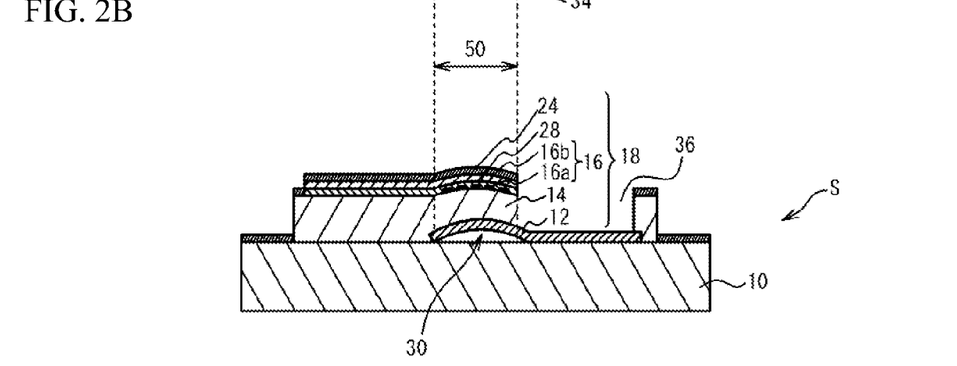
FIG. 2B is a cross-sectional view of a series resonator used in the first embodiment.
Figure 2C:
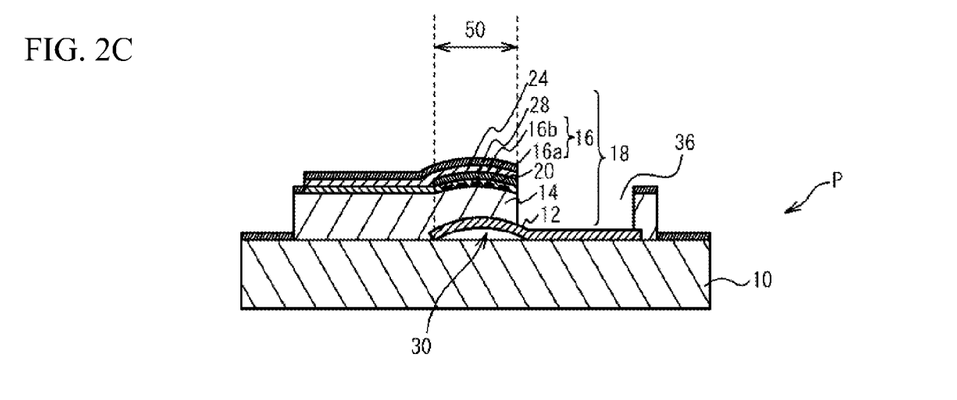
FIG. 2C is a cross-sectional view of a parallel resonator used in the first embodiment.

First, a description is given of an exemplary ladder type filter using an acoustic wave device in accordance with a first embodiment. FIG. 1 is a circuit diagram of such a ladder type filter. Referring to FIG. 1, a ladder type filter 100 is composed of series resonators S1~S4 and parallel resonators P1~P3. The series resonators S1~S4 are connected in series with each other between an input/output terminal T1 and an input/output terminal T2. The parallel resonators P1~P3 are connected in parallel with each other between the input/output terminals T1 and T2. More particularly, the parallel resonator P1 is provided between a node connecting the series resonators S1 and S2 and ground. The parallel resonator P2 is provided between a node connecting the series resonators S2 and S3 and ground. The parallel resonator P3 is provided between a node connecting the series resonators S3 and S4 and ground.
FIG. 2A is a plan view of a piezoelectric thin-film resonator in accordance with the first embodiment, FIG. 2B is a cross-sectional view taken along a line A-A in FIG. 2A in which the piezoelectric thin-film resonator is a series resonator S, and FIG. 2C is a cross-sectional view taken along the line A-A in which the resonator in FIG. 2A is a parallel resonator P. Referring to FIGS. 2A and 2B, the series resonator S is configured as follows. A lower electrode 12 is provided on a substrate 10 made of, for example, silicon, so that a cavity 30 shaped into a dome can be defined between the lower electrode 12 and the substrate 10. The dome-shaped cavity 30 defines a dome-shaped portion of the lower electrode 12. The dome-shaped cavity 30 has a relatively small height in the periphery and has an increasing height towards the center. The lower electrode 12 may include a chromium (Cr) layer and a ruthenium (Ru) layer provided on the Cr layer. A piezoelectric thin-film 14 is provided on the lower electrode 12. The piezoelectric thin-film 14 may be made of aluminum nitride (AlN) having the main axis in the (002) direction. An upper electrode 16 is provided on the piezoelectric thin-film 14 so as to have an area in which the upper electrode 16 faces the lower electrode 12 through the piezoelectric thin-film 14. The above structure in the area is defined as a resonance portion 50. The upper electrode 16 may have a Ru layer 16a and a Cr layer 16b formed on the Ru layer 16a. As described above, the piezoelectric thin-film 14 is provided on the substrate 10, and is sandwiched between the lower electrode 12 and the upper electrode 16, which have portions that overlap each other through the piezoelectric thin-film 14.

A first addition film 28 is provided between the piezoelectric thin-film 14 and the upper electrode 16 in the resonance portion 50. The first addition film 28 has a shape different from that of the resonance portion 50, as will be described later with reference to FIGS. 3A and 3B. The first addition film 28 may be a Ru layer, for example. A frequency adjustment film 24, which may be a silicon oxide film, is provided on the upper electrode 16. A multilayered film 18 includes the lower electrode 12, the piezoelectric thin-film 14, the upper electrode 16, the first addition film 28 and the frequency adjustment film 24.

An introduction path 32 used for etching a sacrificed layer is formed in the lower electrode 12, as illustrated in FIG. 2A. Ends of the introduction path 32 are not covered with the piezoelectric thin-film 14. The lower electrode 12 has holes 34 at the ends of the introduction path 32. As illustrated in FIGS. 2A and 2B, an opening 36 for making an electric connection with the lower electrode 12 is formed in the piezoelectric thin-film 14.

Referring to FIGS. 2A and 2C, the parallel resonator P is configured as follows. The parallel resonator P differs from the series resonator S in that the parallel resonator P has a second addition film 20, which is made of Ti, for example, and is provided between the Ru layer 16a and the Cr layer 16b. Thus, the multilayered film 18 of the parallel resonator P includes the second addition film 20 in the resonance portion 50 in addition to the stacked layers of the series resonator S. The other structures of the parallel resonator P are the same as those of the series resonator S illustrated in FIG. 2B, and a description thereof is omitted here.

In an exemplary case where the piezoelectric thin-film resonator has a resonance frequency of 2 GHz, the Cr layer and the Ru layer of the lower electrode 12 are respectively 100 nm thick and 250 nm thick, and the piezoelectric thin-film 14 formed by the AlN layer is 1150 nm thick. Further, the Ru layer 16a is 250 nm thick, the Cr layer 16b is 20 nm thick, and the first addition film 28 is 10 nm thick. The second addition film 20 is 125 nm thick.

Figure 3A:
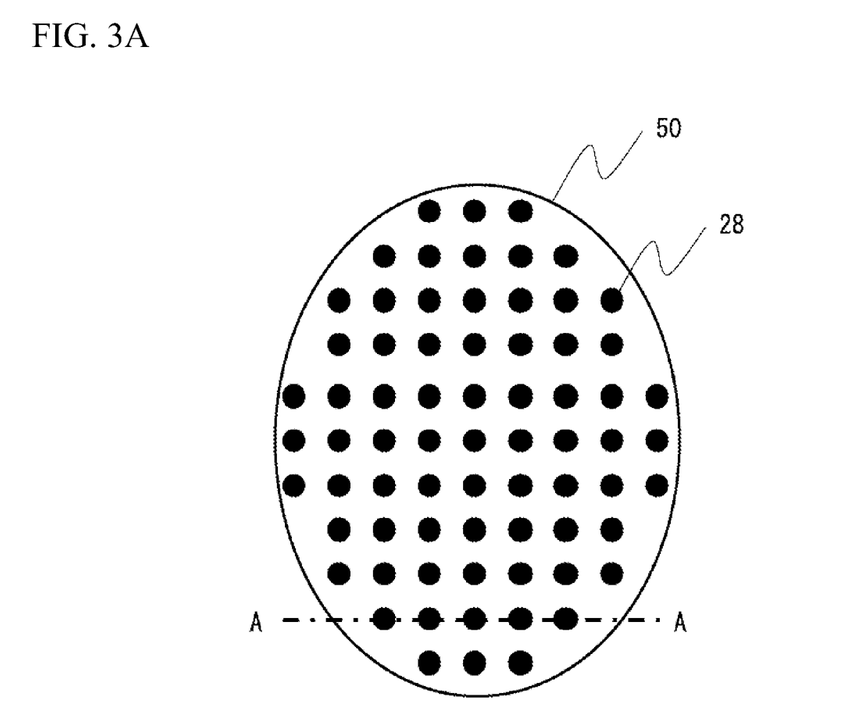
FIG. 3A is a plan view of a first addition film.
Figure 3B:
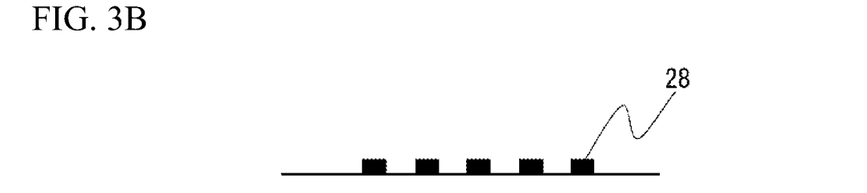
FIG. 3B is a cross-sectional view taken along a line A-A in FIG. 3A.

FIG. 3A is a plan view of an exemplary structure of the first addition film 28, and FIG. 3B is a cross-sectional view taken along a line A-A in FIG. 3A. Referring to FIGS. 3A and 3B, the first addition film 28 includes multiple island-like portions in the resonance portion 50.

Figure 4A:
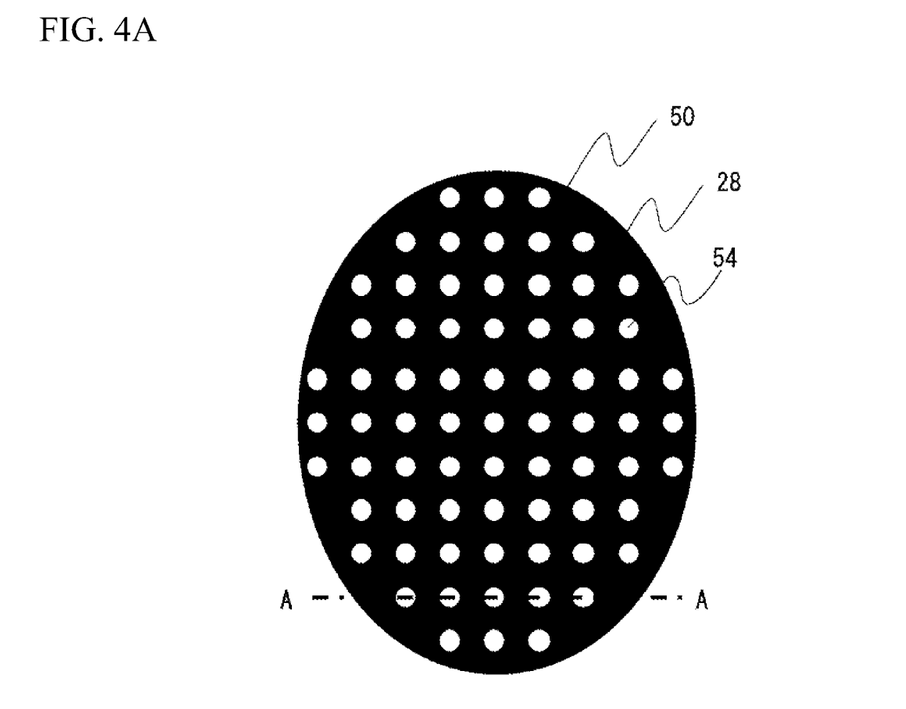
FIG. 4A is a plan view of another example of the first addition film.
Figure 4B:
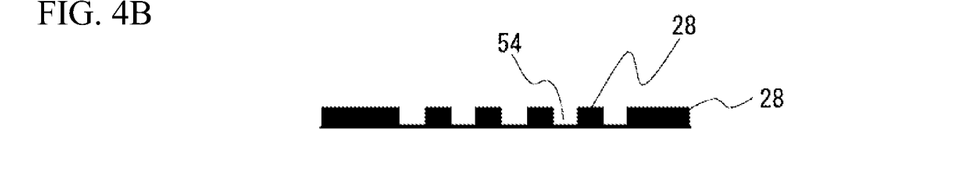
FIG. 4B is a cross-sectional view taken along a line A-A in FIG. 4A.

FIG. 4A is a plan view of another structure of the first addition film 28, and FIG. 4B is a cross-sectional view taken along a line A-A in FIG. 3A. Referring to FIGS. 4A and 4B, the first addition film 28 includes multiple openings 54 in the resonance portion 50.

The first addition film 28 in the resonance portion 50 may have a shape different from that of the resonance portion 50 viewed from the upper side thereof, and may be a film composed of multiple island-like portions or a film having the multiple openings 54. The first addition film 28 has an area that is larger than 0% of the area of the resonance portion 50 and is smaller than 100% thereof. Preferably, the first addition film 28 is uniform over the resonance portion 50. Preferably, the multiple island-like portions of the first addition film 28 are regularly arranged in the area of the resonance portion 50, as illustrated in FIG. 3A. The openings 54 of the first addition film 28 are regularly arranged in the area of the resonance portion 50, as illustrated in FIG. 4A.

Figure 5A:
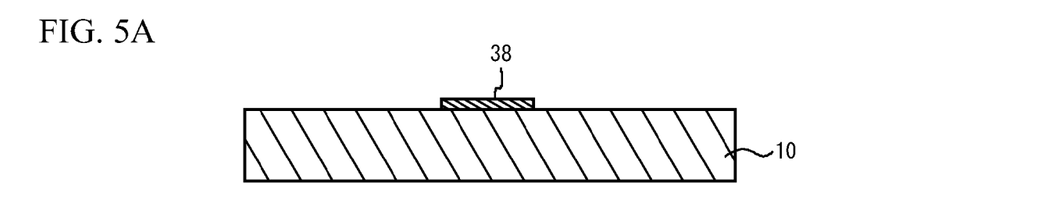
FIGS. 5A through 5E are cross-sectional views that illustrate a method for manufacturing a series resonator.

A description is now given of methods for manufacturing the series resonators S and the parallel resonators P. FIGS. 5A through 5E are cross-sectional views that illustrate a method for manufacturing the series resonator S. FIGS. 6A through 6E are cross-sectional views that illustrate a method for manufacturing the parallel resonator P. Referring to FIGS. 5A and 6A, a magnesium oxide (MgO) film is formed on the substrate 10 as a sacrificing layer 38 by a sputtering or deposition process. The substrate 10 is not limited to the silicon substrate but may be a silica substrate, glass substrate, ceramic substrate or GaAs substrate. The sacrificing layer 38 is not limited to MgO, but may be made of zinc oxide (ZnO), germanium (Ge), titanium (Ti), or copper (Cu). The sacrificing layer 38 is preferably made of a material that is easily dissolved by an etching liquid or etching gas. The sacrificing layer 38 has a predetermined shape, which may be defined by exposure and etching techniques.

Figure 5B:
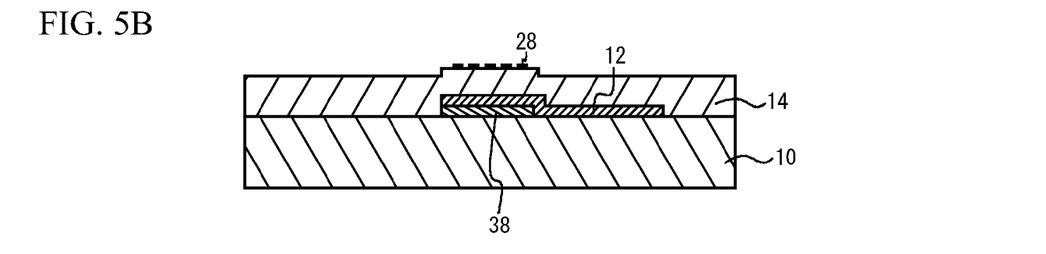
Figure 6A:
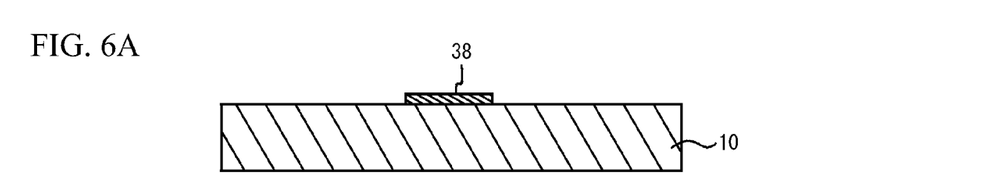
FIGS. 6A through 6E are cross-sectional views that illustrate a method for manufacturing a parallel resonator.
Figure 6B:
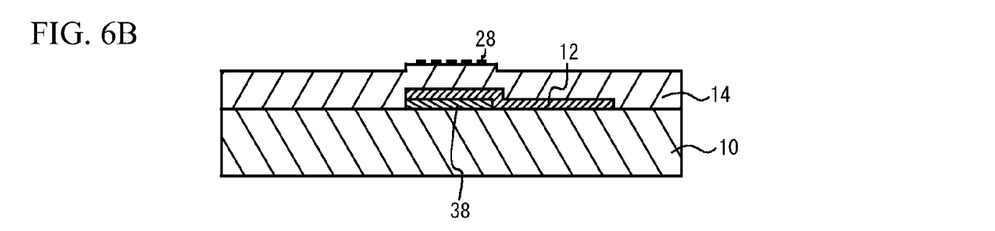

Referring to FIGS. 5B and 6B, the lower electrode 12 is formed by sputtering so as to cover the sacrificing layer 38. Besides Cr and Ru, the lower electrode 12 and the upper electrode 16 may be formed by a metal film of aluminum (Al), copper (Cu), molybdenum (Mo), tungsten (W), tantalum (Ta), platinum (Pt), rhodium (Rh) or iridium (Ir), or a composite film thereof. The lower electrode 12 is not limited to the two-layer structure but may be composed of a single layer or three layers or more. The lower electrode 12 has a predetermined shape, which may be defined by the exposure and etching techniques. The piezoelectric thin-film 14 is formed on the lower electrode 12 and the substrate 10 by sputtering. The piezoelectric thin-film 14 is not limited to AlN but may be made of zinc oxide (ZnO), lead zirconate titanate (PZT) or lead titanate (PbTiO$_3$). The first addition film 28 is formed on the piezoelectric thin-film 14 by sputtering. Besides Ru, the first addition film 28 may be made of Cr, Al, Cu, Mo, W, Ta, Pt, Rh or Ir, or a composite film thereof. Further, the first addition film 28 may be an insulation film such as a metal nitride such as silicon nitride or a metal oxide such as silicon oxide. For the purpose of reducing the resistance, a metal film is preferably used to form the first addition film 28 in order to reduce the resistance of the upper electrode 16. The first addition film 28 has a predetermined shape defined by the exposure and etching techniques.

Figure 5C:
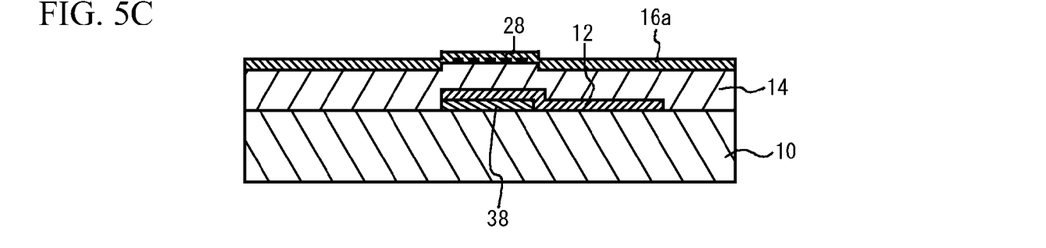
Figure 6C:
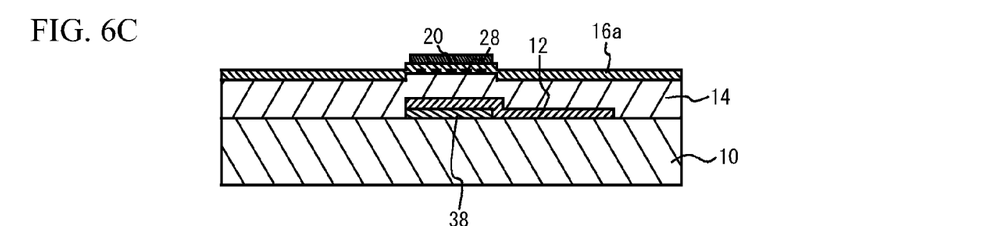

Referring to FIGS. 5C and 6C, the Ru layer 16a is formed by sputtering so as to cover the piezoelectric thin-film 14 and the first addition film 28. The second addition film 20 is formed on the Ru layer 16a. The second addition film 20 is not limited to the Ti film but may be made of any of the materials that have been described as those for the lower electrode 12. Further, the second addition film 20 may be an insulation film such as a metal nitride such as silicon nitride or a metal oxide such as silicon oxide. However, for the purpose of reducing the resistance to the upper electrode 16, a metal film is preferably used to form the second addition film 20. By using the exposure and etching techniques, the second addition film 20 is etched so that the second addition film 20 remains on the Ru layer 16a in the resonance portion 50 of the parallel resonator P and does not remain in the series resonator S. In each of FIGS. 5C and 6C, the upper surface of the Ru layer 16a on the first addition film 28 is illustrated so as to be flat for the sake of simplicity. The thickness of the Ru layer 16a on the first addition film 28 is almost equal to that of the Ru layer 16a on the piezoelectric thin-film 14 on which the first addition film 28 is not formed.

Figure 5D:
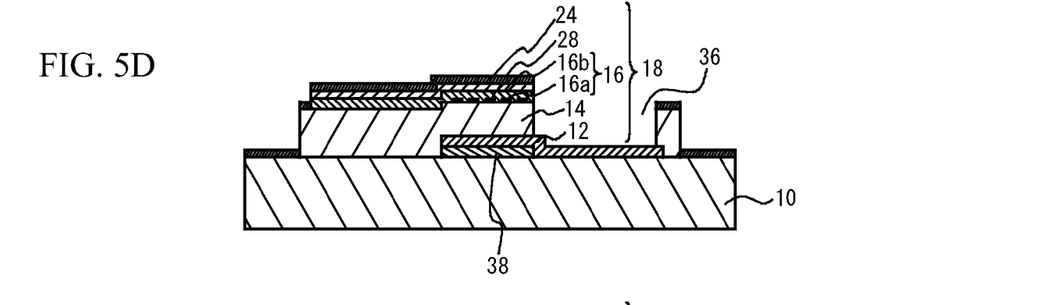
Figure 6D:
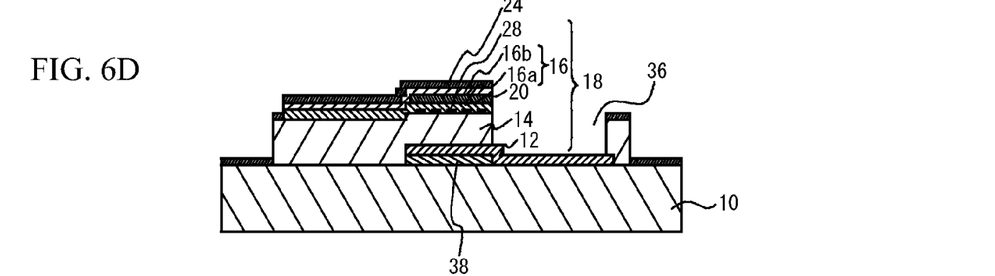

Referring to FIG. 5D, the Cr layer 16b is formed on the Ru layer 16a. Referring to FIG. 6D, the Cr layer 16b is formed on the Ru layer 16a and the second addition film 20 by sputtering. The upper electrode 16 is not limited to the combination of the Ru layer 16a and the Cr layer 16b but may be formed by any of metals that have been described as those for the lower electrode 12. The upper electrode 16 has a predetermined shape defined by the exposure and etching techniques. The frequency adjustment film 24 is formed on the upper electrode 16. The frequency adjustment film 24 may be an insulative film such as a metal oxide film or a metal nitride film other than the silicon oxide film. By using the exposure and etching techniques, the frequency adjustment film 24 and the piezoelectric thin-film 14 have been formed into a predetermined shape, which has the opening 36 through which the lower electrode 12 is exposed.

Figure 5E:
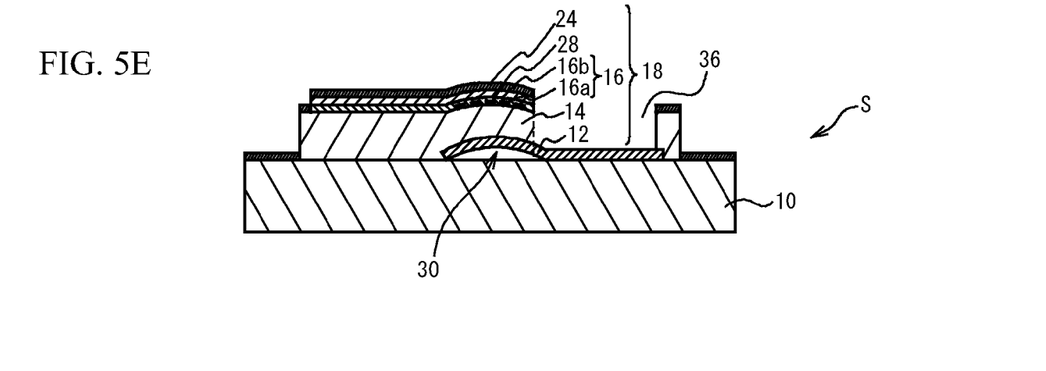
Figure 6E:
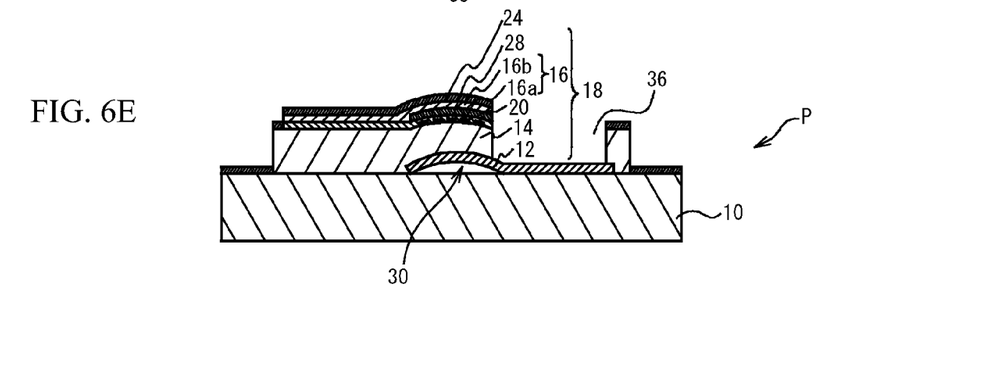

Referring to FIGS. 5E and 6E, an etching liquid for etching the sacrificing layer 38 is introduced through the holes 34 and the introduction path 32 (see FIG. 2A), and the sacrificing layer 38 is thus removed. Stress in the multilayered film 18 composed of the lower electrode 12, the piezoelectric thin-film 14 and the upper electrode 16 is made compressive by adjusting the sputtering conditions. Therefore, the multilayered film 18 is raised when etching of the sacrificing layer 38 is complete, and the dome-shaped cavity 30 is formed upwards between the lower electrode 12 and the substrate 10. Preferably, the etchant for etching the sacrificing layer 38 has a property of not etching the material of the lower electrode 12 on the sacrificing layer 38. Through the above steps, the series resonator S and the parallel resonator P are formed.

The operating principle of the piezoelectric thin-film resonator is now described. When a high-frequency voltage, which is an electric signal, is applied between the upper electrode 16 and the lower electrode 12, an acoustic wave is excited in the piezoelectric thin film 14 of the resonance portion 50 due to the inverse piezoelectric effect. A deformation of the piezoelectric thin-film 14 caused by the acoustic wave is converted into an electric signal between the upper electrode 16 and the lower electrode 12 due to the piezoelectric effect. The acoustic wave is totally reflected by an interface between the film on the upper surface of the piezoelectric thin-film 14 and air and an interface between the film on the lower surface thereof and air. Thus, a longitudinal vibration having main displacements in the thickness direction of the piezoelectric thin-film 14 is caused. By utilizing resonance of the longitudinal vibration, a resonator or filter having a desired frequency characteristic is realized. In the first embodiment, the above-described film on the upper surface of the piezoelectric thin-film 14 includes the upper electrode 16, the first addition film 28, the second addition film 20 and the frequency adjustment film 24. The above-described film on the lower surface of the piezoelectric thin-film 14 is the lower electrode 12.

It is assumed that H is the total thickness of the film formed on the lower surface of the piezoelectric thin-film 14, the piezoelectric thin-film 14, and the film formed on the upper surface of the piezoelectric thin-film 14. The resonance takes place at frequencies equal to integer multiples (n times) of ½ of the wavelength λ of the acoustic wave (that is, at frequencies at which $H=n\lambda/2$). Assuming that V is the propagation velocity of the acoustic wave defined by the material of the piezoelectric thin-film 14, the resonance frequency F is expressed as $F=nV/(2H)$. Thus, the resonance frequency F can be controlled by the total thickness H of the multilayered film 18.

For example, when the ladder type filter 100 in FIG. 1 is designed, the resonance frequencies of the series resonators S1~S4 are made different from those of the parallel resonators P1~P3. As illustrated in FIG. 2C, the second addition film 20 is formed in the resonance portion 50 of each of the parallel resonators P1~P3, and is not formed in the resonance portion 50 of each of the series resonators S1~S4. It is thus possible to make the resonance frequencies of the series resonators S1~S4 different from those of the parallel resonators P1~P3. The second addition film 20 may be formed in not only the upper electrode 16 but also any of the multilayered film 18 in the resonance portion 50. The second addition film 20 may be omitted. For example, at least one of the lower electrode 12, the piezoelectric thin-film 14, and the upper electrode 16 layer in each of the series resonators S1~S4 has a thickness different from that of a corresponding one of those layers in each of the parallel resonators P1~P3.

As illustrated in FIGS. 5D and 6D, the frequency adjustment films 24 having the same thickness may be added to both the resonance portions 50 of the series resonators S1~S4 and those of the parallel resonators P1~P3. By adjusting the thicknesses of the frequency adjustment films 24 concurrently, it is possible to adjust both the resonance frequencies of the series resonators S1~S4 and those of the parallel resonators P1~P3 on the same time.

In order to obtain lower loss and broader band filter characteristics, it is preferable that the series resonators S1~S4 have different resonance frequencies. Similarly, it is preferable that the parallel resonators P1~P3 have different resonance frequencies. Further, it is preferable that all of the resonators of the ladder type filter have mutually different frequencies. As illustrated in FIGS. 3A and 4A, the first addition film 28 having the shape different from that of the area of the resonance portion 50. Further, the first addition films 28 of the series resonators S1~S4 or the parallel resonators P1~P3 have different shapes in the resonance portions 50. It is thus possible to arbitrarily set the resonance frequencies of the series resonators S1~S4.

As described above, according to the first embodiment, the first addition film 28 is provided in the resonance portion 50 and has a shape different from that of the first resonance portion 50. In other words, the first addition film 28 is provided in part of the resonance portion 50. That is, the resonance portion 50 has part or areas in which the first addition film 28 is not formed. It is thus possible to arbitrarily select the resonance frequencies of the piezoelectric thin-film resonators.

In Document 2, the addition film is formed on the upper electrode. It is therefore required to secure a sufficient etching selectively of the addition film with respect to the upper electrode. This requirement limits the range of selection of materials for the addition film and the upper electrode. For example, the upper electrode and the addition film cannot be formed by the same material. In contrast, according to the first embodiment, the first addition film 28 is provided between the piezoelectric thin-film 14 and the upper electrode 16. Therefore, as illustrated in FIGS. 5B and 6B, the first addition film 28 is only required to have a sufficient etching selectivity to the piezoelectric thin-film 14. It is thus possible to obtain a wider range of selection of materials for the first addition film 28 and the upper electrode 16. For example, the first addition film 28 and the upper electrode 16 may be formed by the same material. For example, both the first addition film 28 and the upper electrode 16 may be films that have a large acoustic impedance, may be made of Ru.

As will be described later with reference to FIGS. 7A through 7F that illustrate a second embodiment, in a case where the first addition film 28 is formed below the piezoelectric thin-film 14, the orientation of the piezoelectric thin-film 14 may deteriorate and the resonance characteristic may deteriorate in the process of forming the piezoelectric thin-film 14 on the lower electrode 12 in FIGS. 5B and 6B. According to the first embodiment, since the first addition film 28 is formed on the piezoelectric thin-film 14, it is possible to improve the orientation and resonance characteristic of the piezoelectric thin-film 14.

The multiple piezoelectric thin-film resonators of the acoustic wave device illustrated in FIG. 1 have the different areas of the first addition films 28 in the resonance portions 50. It is thus possible to realize the piezoelectric thin-film resonators having the different resonance frequencies without an increase in the number of steps of forming the additional films.

Preferably, either the series resonators S1~S4 or the parallel resonators P1~P3 include multiple piezoelectric thin-film resonators having the first addition films 28 having different areas in the resonance portions 50. It is thus possible to realize the series resonators S1~S4 or the parallel resonators P1~P3 having the different resonance frequencies and to realize the low loss, wideband ladder type filter.

Second Embodiment

Figure 7A:
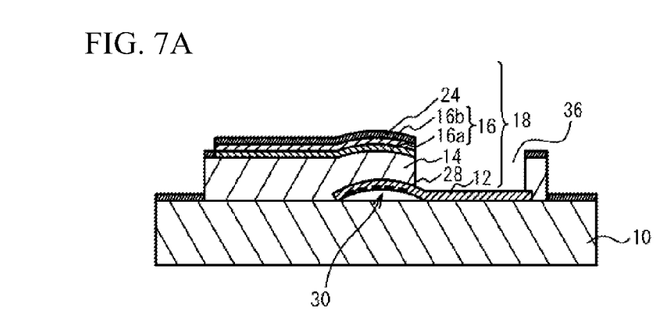
FIGS. 7A through 7C are cross-sectional views of a series resonator used in a second embodiment.
Figures 7B, 7C:
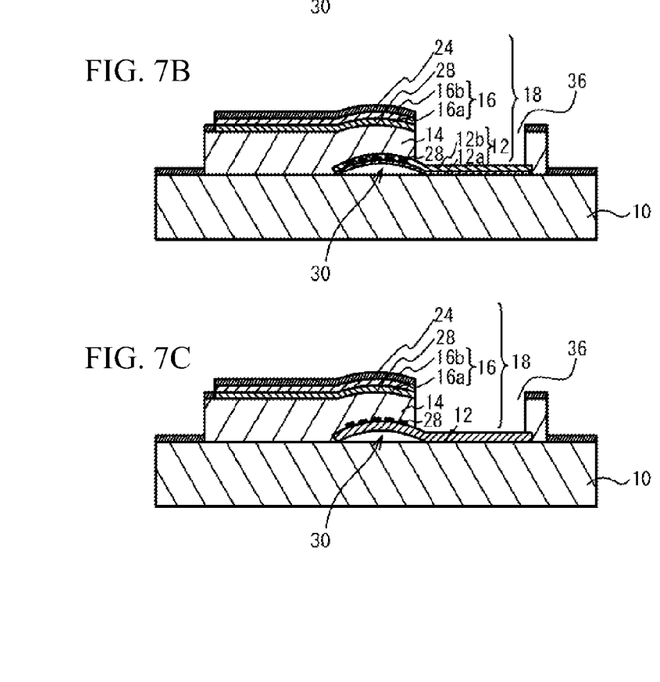
Figure 7D:
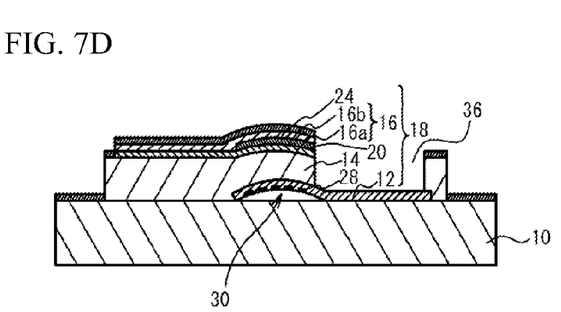
FIGS. 7D through 7F are cross-sectional views of a parallel resonator used in the second embodiment.
Figures 7E, 7F:
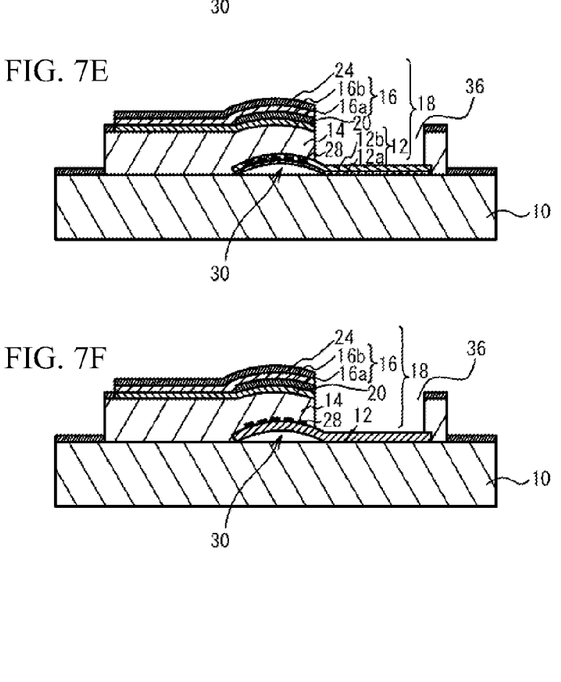

A second embodiment has an exemplary structure in which the first addition film 28 is provided between layers of the multilayered film 18 other than those of the first embodiment. FIG. 7A through 7C are cross-sectional views of series resonators of the second embodiment, and FIGS. 7D through 7F are cross-sectional views of parallel resonators thereof. Referring to FIGS. 7A and 7D, the first addition film 28 may be provided below the lower electrode 12. In this structure, it is preferable that the first addition film 28 has a sufficient etching selectivity to the sacrificing layer 38. Referring to FIGS. 7B and 7E, the lower electrode 12 may have multiple layers 12a and 12b or more, and the first addition film 28 may be provided between two adjacent ones of the multiple layers 12a and 12b. In this structure, it is preferable that the first addition film 28 has a sufficient etching selectivity to the layer 12a. Referring to FIGS. 7C and 7F, the first addition film 28 may be provided between the lower electrode 12 and the piezoelectric thin-film 14. In this structure, it is preferable that the first addition film 28 has a sufficient etching selectively to the lower electrode 12.

Figure 8A:
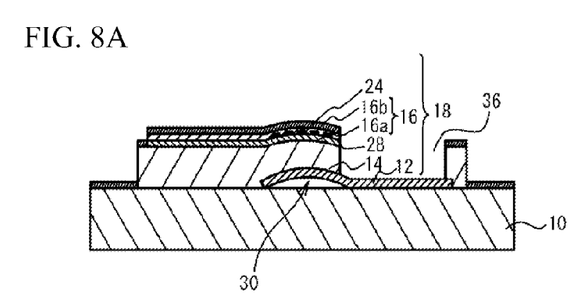
FIGS. 8A through 8C are cross-sectional views of another series resonator used in the second embodiment.
Figure 8B:
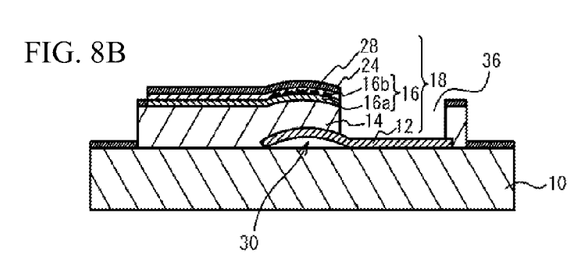
Figure 8C:
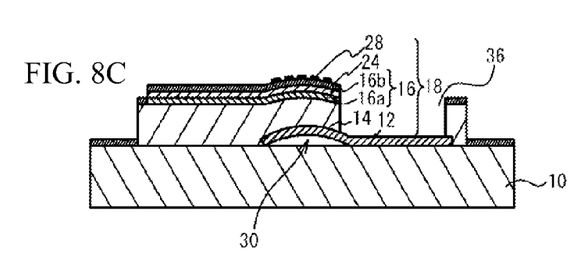
Figure 8D:
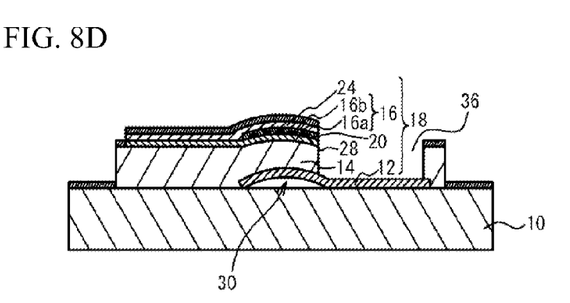
FIGS. 8D through 8F are cross-sectional views of another parallel resonator used in the second embodiment.
Figure 8E:
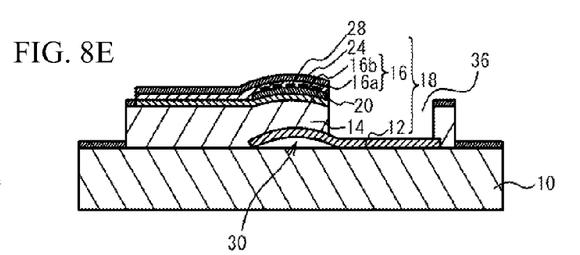
Figure 8F:
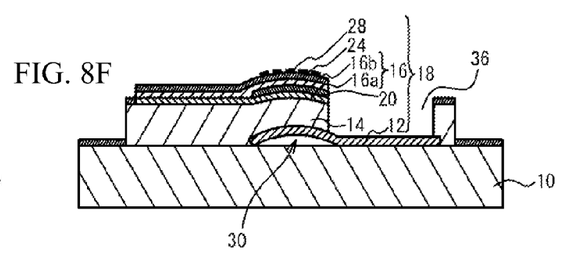

FIGS. 8A through 8C are cross-sectional views of series resonators having different structures in accordance with the second embodiment, and FIGS. 8D through 8F are cross-sectional views of parallel resonators having different structures in accordance with the second embodiment. Referring to FIGS. 8A and 8D, the first addition film 28 of the series resonator is provided between the Ru layer 16a and the Cr layer 16b, and the first addition film 28 of the parallel resonator is provided between the Ru layer 16a and the second addition film 20. In this case, it is preferable that the first addition film 28 has an etching selectivity to the Ru layer 16a. Referring to FIGS. 8B and 8E, the first addition film 28 of the series resonator is provided between the Ru layer 16a and the Cr layer 16b, and the first addition film 28 of the parallel resonator is provided between the second addition film 20 and the Cr layer 16b. In this case, it is preferable that the first addition film 28 has an etching selectivity to the Ru layer 16a and the second addition film 20. Referring to FIGS. 8C and 8F, the first addition film 28 is provided on the frequency adjustment film 24. In this case, it is preferable that the first addition film 28 has an etching selectivity to the frequency adjustment film 24.

According to the second embodiment, as illustrated in FIGS. 7A and 7D, the first addition film 28 may be provided below the lower electrode 12 in the resonance portion 50. As illustrated in FIGS. 7B, 7E, 8A, 8D, 8B and 8E, at least one of the lower electrode 12 and the upper electrode 16 includes at least two layers. The first addition film 28 may be provided between the adjacent layers out of the at least two layers in the resonance portion 50.

As illustrated in FIGS. 8C and 8F, the frequency adjustment film 24, which is an insulative layer, is provided on the upper electrode 16. The first addition film 28 may be provided on the insulative layer. Like the first embodiment, the second embodiment is capable of adjusting the resonance frequency of the resonator arbitrarily.

Like the first embodiment, the second embodiment may be an acoustic wave device having multiple piezoelectric thin-film resonators as illustrated in FIG. 1, wherein the multiple piezoelectric thin-film resonators are configured to have different areas of the first addition films 28 in the resonance portions 50. Either the series resonators S1~S4 or the parallel resonators P1~P3 may include piezoelectric thin-film resonators having different areas of the first addition films 28 in the resonance portions 50.

Third Embodiment

Figure 9A:
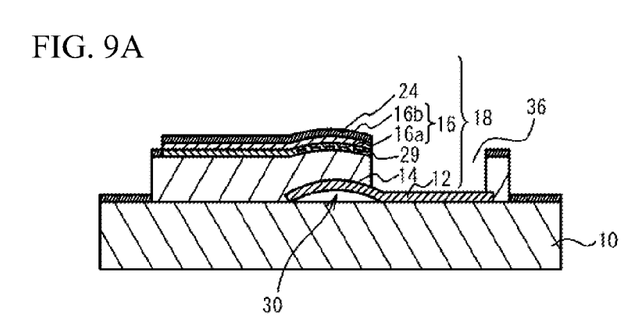
FIGS. 9A through 9C are cross-sectional views of a series resonator used in a third embodiment.
Figure 9B:
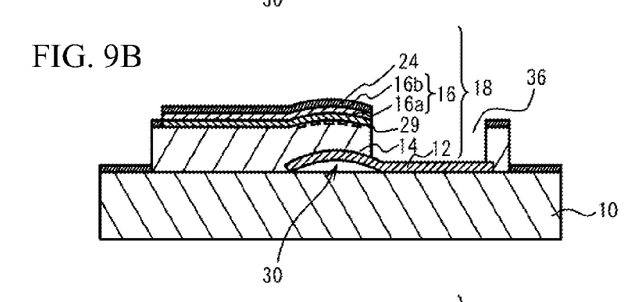
Figure 9C:
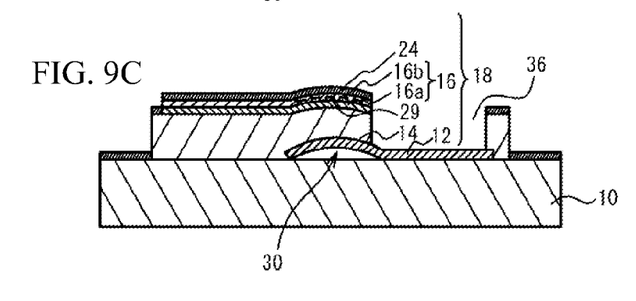
Figure 9D:
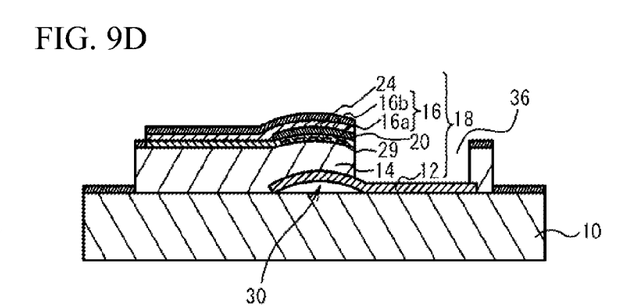
FIGS. 9D through 9F are cross-sectional views of a parallel resonator used in the third embodiment.
Figure 9E:
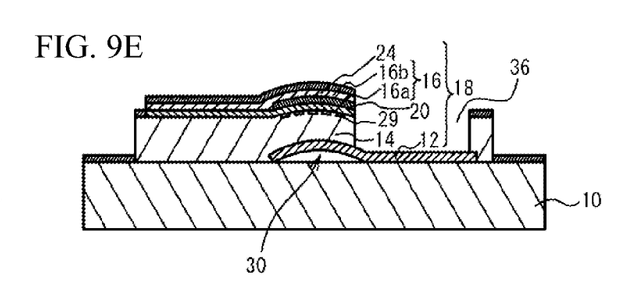
Figure 9F:
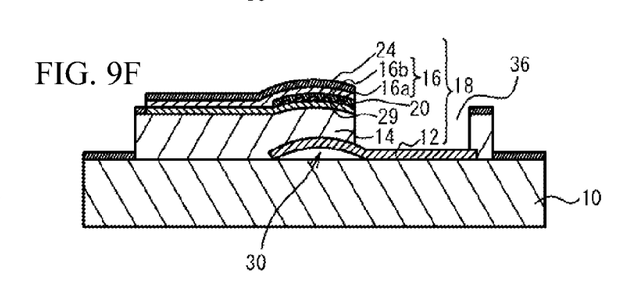

A third embodiment is an exemplary acoustic wave device using empty spaces instead of the first addition film. FIGS. 9A through 9C are cross-sectional views of series resonators used in the third embodiment, and FIGS. 9D through 9F are cross-sectional views of parallel resonators used in the third embodiment. Referring to FIGS. 9A and 9D, empty spaces 29 forming a shape different from that of the resonance portion 50 are provided between the piezoelectric thin-film 14 and the upper electrode 16 in the resonance portion 50. The empty spaces 29 are formed in the Ru layer 16a.

Referring to FIGS. 9B and 9E, empty spaces 29 forming a shape different from that of the resonance portion 50 are provided between the piezoelectric thin-film 14 and the upper electrode 16 in the resonance portion 50. The empty spaces 29 are formed in the piezoelectric thin-film 14.

As described above, at least one of the lower electrode 12 and the upper electrode 16 has empty spaces that are provided between the piezoelectric thin-film 14 and the electrode 12 or 16 in the resonance portion 50 and form a shape different from that of the resonance portion 50. Thus, it is possible to arbitrarily set the resonance frequency of the resonator as in the case of the first embodiment.

Referring to FIGS. 9C and 9F, the series resonator is configured to have the empty spaces 29 between the Ru layer 16a and the Cr layer 16b of the upper electrode 16, and the parallel resonator is configured to have the empty spaces 29 between the Ru layer 16a and the second addition film 20.

As described above, at least one of the lower electrode 12 and the upper electrode 16 has multiple layers. At least one of the lower electrode 12 and the upper electrode 16 may be configured to have the empty spaces 29 that are provided between the piezoelectric thin-film 14 and the electrode 12 or 16 in the resonance portion 50 and form a shape different from that of the resonance portion 50. Thus, like the first embodiment, the resonance frequency of the resonator may be adjusted arbitrarily.

The empty spaces 29 may be formed like islands in the resonance portion 50 as the first addition film 28 illustrated in FIG. 3A. The empty spaces 29 may be formed so that the resonance portion 50 has areas in which the empty spaces 29 are not formed as in the case of the first addition film 28 illustrated in FIG. 4A.

In a case where the empty spaces 29 are formed below the piezoelectric thin-film 14, the orientation of the piezoelectric thin-film 14 may deteriorate in the process of forming the piezoelectric thin-film 14 on the lower electrode 12, whereby the resonance characteristic may deteriorate. The presence of the empty spaces 29 on the piezoelectric thin-film 14 improves the orientation of the piezoelectric thin-film 14 and the resonance characteristic.

The acoustic wave device including the multiple piezoelectric thin-film resonators as illustrated in FIG. 1 may be configured so that the empty spaces 29 have different areas in the resonance portions 50. It is thus possible to realize the piezoelectric thin-film resonators having the different resonance frequencies without an increase in the number of steps of forming the additional films. Preferably, either the series resonators S1~S4 or the parallel resonators P1~P3 include multiple piezoelectric thin-film resonators having the empty spaces 29 having different areas in the resonance portions 50. It is thus possible to realize the series resonators S1~S4 or the parallel resonators P1~P3 having the different resonance frequencies and to realize the low loss, wideband ladder type filter.

Fourth Embodiment

Figure 10A:
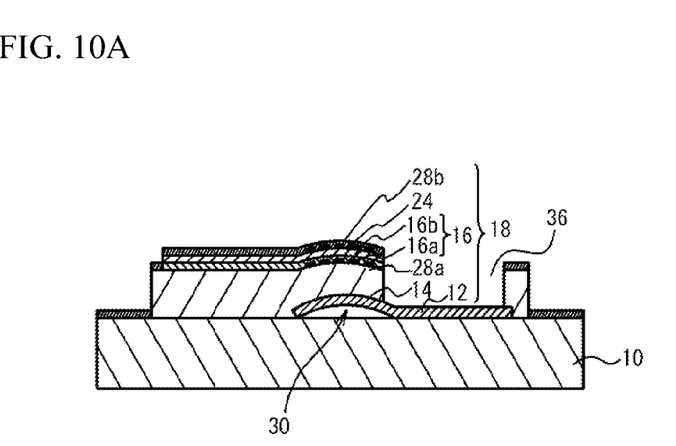
FIGS. 10A and 10B are cross-sectional views of a series resonator used in a fourth embodiment.
Figure 10B:
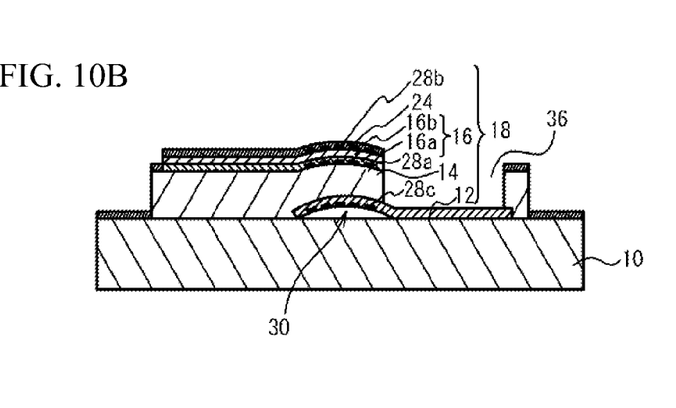
Figure 10C:
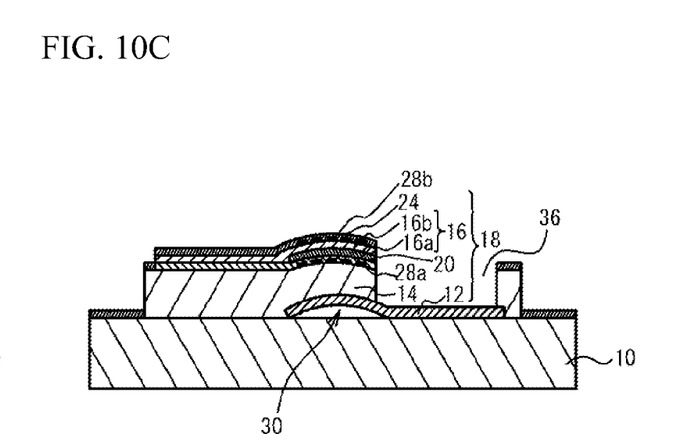
FIGS. 10C and 10D are cross-sectional views of a parallel resonator used in the fourth embodiment.
Figure 10D:
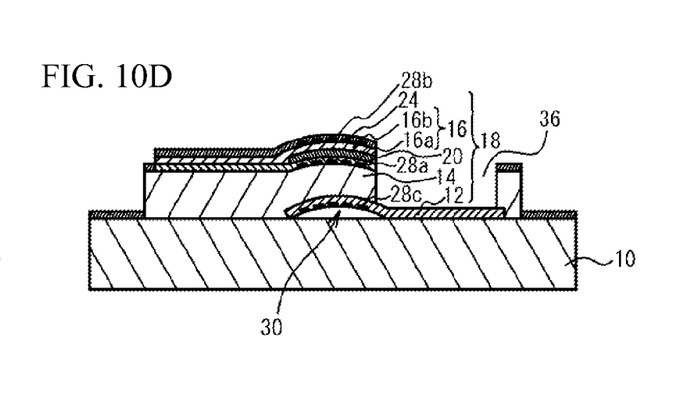

A fourth embodiment is an exemplary acoustic wave device having the first addition film composed of at least two layers. FIGS. 10A and 10B are cross-sectional views of series resonators used in the fourth embodiment, and FIGS. 10C and 10D are cross-sectional views of parallel resonators thereof. Referring to FIGS. 10A and 10C, a first addition film 28a having a shape different from that of the resonance portion 50 is provided between the piezoelectric thin-film 14 and the upper electrode 16 in the resonance portion 50. Further, another first addition film 28b having a shape different from that of the resonance portion 50 is provided between the upper electrode 16 and the frequency adjustment film 24 in the resonance portion 50.

Referring to FIGS. 10B and 10D, yet another first addition film 28c having a shape different from that of the resonance portion 50 is provided below the lower electrode 12 in the resonance portion 50 in addition to each of the structures illustrated in FIGS. 10A and 10C.

As described above, the first addition film 28 may be provided in at least two positions in the resonance portion 50 selected from among the position between the piezoelectric thin-film 14 and the lower electrode 12, that between the piezoelectric thin-film 14 and the upper electrode 16, that between layers within the lower electrode 12, that between layers within the upper electrode 16, that above the upper electrode 16, that below the lower electrode 12, that above the frequency adjustment film (insulative film) 24 on the upper electrode 16. In the case where the first addition film 28 is provided in only part of the resonance portion 50, the characteristics of the piezoelectric thin-film resonator may deteriorate if the first addition film 28 is relatively thick. This case has a limited resonance frequency adjustable range. According to the fourth embodiment, the first addition film 28 is composed of at least two layers, whereby each of the at least two layers has a smaller thickness. It is thus possible to expand the resonance frequency adjustable range.

As in the cases of the first and second embodiments, the acoustic wave device including the multiple piezoelectric thin-film resonators as illustrated in FIG. 1 may be configured so that at least one of the first addition films 28a~28c of each or some of the multiple piezoelectric thin-film resonators have a different area in the resonance portion 50. Either the series resonators S1~S4 or the parallel resonators P1~P3 include piezoelectric thin-film resonators configured so that at least one of the first addition films 28a~28c of each of the resonators has a different area in the resonance portion 50. At least one of the first addition films 28a through 28c may be the empty spaces 29.

Fifth Embodiment

Figure 11:
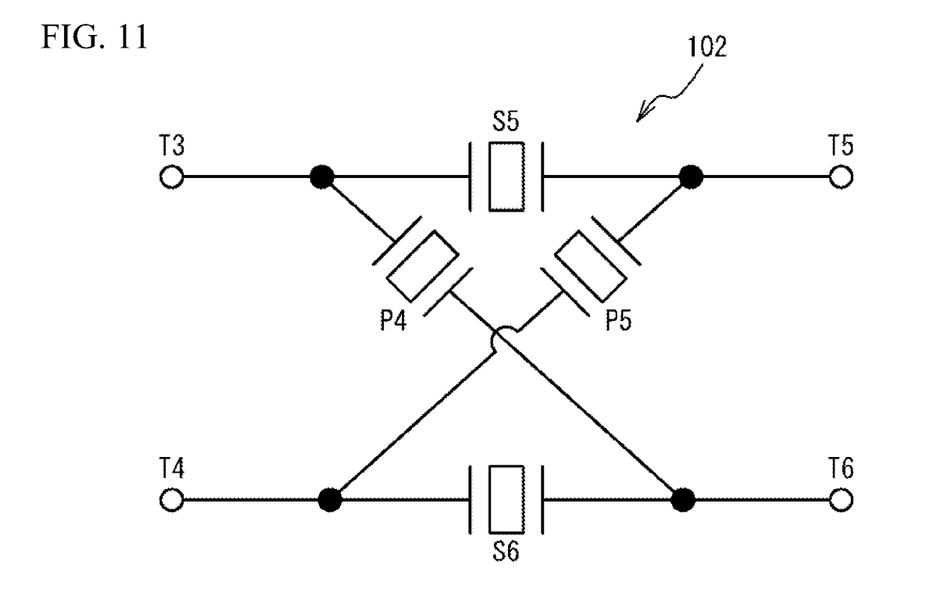
FIG. 11 is a circuit diagram of a lattice type filter.

A fifth embodiment is an exemplary lattice type filter. FIG. 11 is a lattice type filter in accordance with a fifth embodiment. Referring to FIG. 11, a lattice type filter 102 is composed of series resonators S5 and S6 and parallel resonators P4 and P5. A series resonator S5 is connected between terminals T3 and T5, and a series resonator S6 is connected between terminals T4 and T6. A parallel resonator P4 is connected between the terminals T3 and T6, and a parallel resonator P5 is connected between the terminals T4 and T5. The series resonators S5 and S6 and the parallel resonators P4 and P5 may be any of the series resonators and the parallel resonators of the first through third embodiments. The lattice type filter 102 thus configured has a suppressed spurious level as in the case of the ladder type filter. Further, the lattice type filter 102 has a wide frequency adjustable range. The resonators of the first through fourth embodiments may be applied to filters other than the ladder type filter and the lattice type filter.

In a duplexer including a reception filter and a transmission filter, at least one of the reception filter and the transmission filter may be a filter configured in accordance with one of the first through fifth embodiments.

The above-described first through fifth embodiments have film bulk acoustic wave resonators as the piezoelectric thin-film resonators in which the cavity 30 is formed between the multilayered film 18 and the substrate 10. The piezoelectric thin-film resonators may have another structure in which a cavity is formed in the substrate and the multilayered film 18 is exposed to the cavity in the substrate. The cavity may be replaced with an acoustic reflection film having the function of reflecting acoustic waves. A resonator having such an acoustic reflection film is called solidly mounted resonator (SMR). The acoustic reflection film may be formed by alternately stacking a first film and a second film multiple times, wherein the first film has a relatively high acoustic impedance and the second film has a relatively low acoustic impedance.

The present invention is not limited to the specifically disclosed embodiments but other embodiments and variations may be made without departing from the scope of the claimed invention.

What is claimed is:

1. An acoustic wave device comprising a piezoelectric thin-film resonator including:
   a substrate;
   a piezoelectric thin-film on the substrate;
   a lower electrode provided on a first surface of the piezoelectric film;
   an upper electrode provided on a second surface of the piezoelectric film opposite to the first surface, at least one of the lower electrode and the upper electrode including layers; and
   a first addition film that is provided in a resonance portion in which the lower electrode and the upper electrode face each other through the piezoelectric film and is located between the layers of the at least one of the lower electrode and the upper electrode,
   the first addition film having a shape different from that of the resonance portion.

2. The acoustic wave device according to claim 1, wherein the first addition film includes a material that is the same as that of the upper electrode.

3. The acoustic wave device according to claim 1, further comprising piezoelectric thin-film resonators, each of which has the first addition film having a different area.

4. The acoustic wave device according to claim 1, comprising: multiple piezoelectric thin-film resonators that include a series resonator having no second addition film in the resonance portion of the series resonator, and a parallel resonator having a second addition film in the resonance portion of the parallel resonator, wherein at least one of the multiple piezoelectric thin film resonators is said piezoelectric thin film resonator according to claim 1.

5. The acoustic wave device according to claim 1, comprising: multiple piezoelectric thin-film resonators that are series and/or parallel resonators, wherein each of at least two of the multiple piezoelectric thin film resonators is said piezoelectric thin film resonator according to claim 10, and the at least two of the multiple piezoelectric thin film resonators have the first addition films having different areas in the resonance portions.

6. The acoustic wave device according to claim 1, comprising:
   multiple piezoelectric thin-film resonators that are connected to form a ladder type or lattice type filter, wherein at least one of the multiple piezoelectric thin film resonators is said piezoelectric thin film resonator according to claim 10.

7. The acoustic wave device according to claim 1, wherein the first addition film has island portions arranged in the resonance portion.

8. The acoustic wave device according to claim 1, wherein the first addition film has openings arranged in the resonance portion.

9. An acoustic wave device comprising a ladder type or lattice type filter that includes a series resonator and a parallel resonator, wherein each of the series resonator and the parallel resonator is a piezoelectric thin-film resonator including:
   a substrate;
   a piezoelectric thin-film on the substrate;
   a lower electrode provided on a first surface of the piezoelectric film;
   an upper electrode provided on a second surface of the piezoelectric film opposite to the first surface; and
   a first addition film that is provided in a resonance portion in which the lower electrode and the upper electrode face each other through the piezoelectric film and is composed of two different layers that are located above the piezoelectric thin film,
   the two different layers of the first addition film having shapes different from that of the resonance portion,
   wherein the first addition film has island portions or openings arranged in the resonance portion, and
   wherein the parallel resonator has a second addition film in the resonance portion.

10. The acoustic wave device according to claim 9, wherein the first addition film includes a material that is the same as that of the upper electrode.

11. The acoustic wave device according to claim 9, further comprising an insulative film provided on the upper electrode; wherein one of the feast two different layers of the first additional film is located on the insulative film.

12. The acoustic wave device according to claim 9, wherein the series resonator has no second addition film in the resonance portion.

13. An acoustic wave device comprising a piezoelectric thin-film resonator including:
   a substrate;
   a piezoelectric thin-film on the substrate;
   a lower electrode provided on a first surface of the piezoelectric film; and
   an upper electrode provided on a second surface of the piezoelectric film opposite to the first surface,
   at least one of the lower electrode and the upper electrode having layers between which empty spaces are provided in a resonance portion in which the lower electrode and the upper electrode face each other through the piezoelectric film and form a shape different from that of the resonance portion.

14. The acoustic wave device according to claim 13, further comprising piezoelectric thin-film resonators having different areas of the empty spaces.

15. The acoustic wave device according to claim 13, wherein the piezoelectric thin-film resonator includes a series resonator having no addition film in the resonance portion, and a parallel resonator having an addition film.

16. The acoustic wave device according to claim 13, wherein the piezoelectric thin-film resonator includes multiple resonators having different areas of the empty spaces in the resonance portions, and the multiple resonators are series and/or parallel resonators.

17. The acoustic wave device according to claim 16, wherein the multiple resonators are connected to form a ladder type or lattice type filter.

18. An acoustic wave device comprising a ladder type or lattice type filter that includes a series resonator and a parallel resonator, wherein each of the series resonator and the parallel resonator is a piezoelectric thin-film resonator including:
   a substrate;
   a piezoelectric thin-film on the substrate;
   a lower electrode provided on a first surface of the piezoelectric film;
   an upper electrode provided on a second surface of the piezoelectric film opposite to the first surface; and
   a first addition film that is provided in a resonance portion in which the lower electrode and the upper electrode face each other through the piezoelectric film and is composed of two different layers that are located between the piezoelectric thin-film and the upper electrode and below the lower electrode,
   the two different layers of the first addition film having shapes different from that of the resonance portion, wherein the first addition film has island portions or openings arranged in the resonance portion, and wherein the parallel resonator has a second addition film in the resonance portion.

* * * * *